United States Patent [19]

Evans

[11] Patent Number: 4,503,608
[45] Date of Patent: Mar. 12, 1985

[54] CARD EDGE CONNECTOR TOOL AND A METHOD OF JOINING A CARD EDGE CONNECTOR

[75] Inventor: Evan Evans, Dallas, Tex.

[73] Assignee: Elfab Corporation, Lewisville, Tex.

[21] Appl. No.: 467,123

[22] Filed: Feb. 16, 1983

[51] Int. Cl.³ .............................................. H05K 3/30
[52] U.S. Cl. ................................ 29/839; 339/176 MP
[58] Field of Search ................ 29/832, 834, 747, 739, 29/759; 339/176 MF, 75 MP, 79 R, 65, 176 MP, 49 R

[56] References Cited

U.S. PATENT DOCUMENTS

| | | | |
|---|---|---|---|
| 3,020,511 | 2/1962 | Raver | 339/6 S |
| 3,611,259 | 10/1971 | Palecek | 339/176 MP X |
| 4,159,861 | 7/1979 | Anhalt | 339/75 MP |
| 4,193,108 | 3/1980 | Romano | 339/176 MP X |
| 4,253,719 | 3/1981 | McGinley | 339/176 MP X |
| 4,429,454 | 2/1984 | Broyer et al. | 29/832 |

Primary Examiner—Howard N. Goldberg
Assistant Examiner—Carl J. Arbes
Attorney, Agent, or Firm—John E. Vandigriff

[57] ABSTRACT

A tool for and a method of inserting a printed circuit board on to a contact assembly is described in which the board is positioned between opposing contact fingers by rotating the circuit board on an alignment pin so that solder pads on the circuit board are aligned with and positioned between the contact fingers one at a time.

9 Claims, 6 Drawing Figures

CARD EDGE CONNECTOR TOOL AND A METHOD OF JOINING A CARD EDGE CONNECTOR

BACKGROUND OF THE INVENTION

1. Field of the Invention

This invention relates to printed circuit boards and more particularly to a tool and method of inserting and attaching a card edge connector assembly to board edge contacts on a printed circuit board.

2. Description of the Prior Art

Printed circuit boards usually consists of a flat sheet of insulation material such as glass epoxy. Conductive paths, usually copper, interconnect various part of the circuit board to connect components on the board with each other and to generally form a circuit made up of the interconnected components. To attach the board with other circuits, a plurality of parallel conductive stripes or fingers extend to the edge of the board. The fingers are at predetermined spacing to correspond to the spacing of card edge connectors.

In U.S. application Ser. No. 411,516, filed Aug. 25, 1982, entitled PRINTED CIRCUIT BOARD CONNECTOR AND METHOD OF MANUFACTURE, a novel contact finger assembly is described wherein printed circuit boards are connected to the finger assembly to provide an improved connector. As in the attachment of all connectors, certain frictional forces must be overcome before the connector mating parts become fully engaged. In the insertion of printed circuit boards into card edge connectors, if there is not incorporated onto the connector or circuit board some means of aligning the two parts, there is a possibility of misalignment of the card edge connector and the contacts on the circuit board.

SUMMARY OF THE INVENTION

The invention is a tool for and a method of inserting the contact finger assembly of U.S. patent application Ser. No. 411,516, filed Aug. 25, 1983, onto a printed circuit board to align with and engage the contact areas on the printed circuit board.

A base plate has a contact assembly holder mounted thereon. The contact assembly holder has an alignment grove therein into which the contact assembly is inserted. Adjacent to one corner of the assembly holder is an alignment pin. The circuit board on which the contact assembly is to be mounted has an alignment hole positioned at one end of the circuit board where contact solder pads to be bonded to the contact assembly are located. The alignment hole is placed over the alignment hole and the circuit board is rotated to insert the circuit board, one solder pad at a time into the contact assembly. By inserting the solder pads one at a time, the insertion force is greatly reduced from the insertion force that would be required to insert all of the solder pads at one time. Also, the alignment pin on the base plate and the alignment hole in the circuit board aligns the solder pads with the contact fingers on the contact assembly. The contact fingers are then bonded to the solder pads and a carrier strip is then removed that initially holds the contacts together in alignment for insertion into the contact assembly and aids in maintaining the spacing between contact fingers prior to bonding them to the solder pads.

DESCRIPTION OF THE PREFERRED EMBODIMENT OF THE INVENTION

Figure 1:
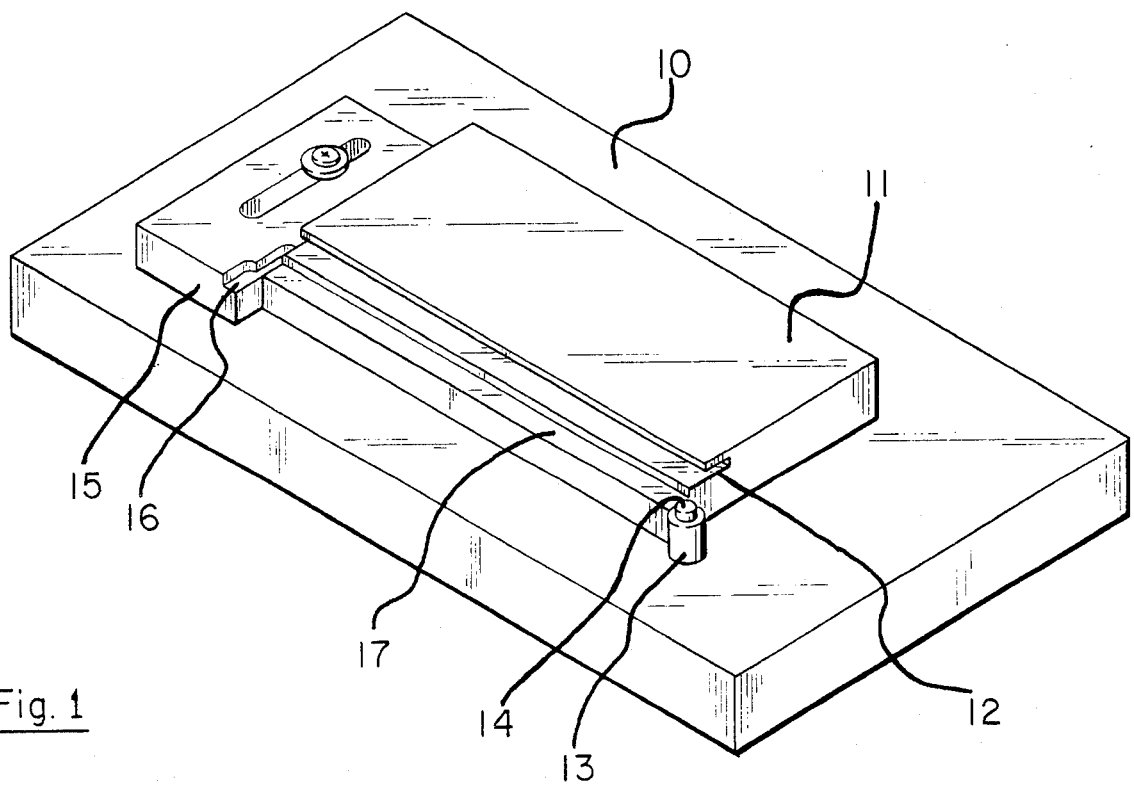
FIG. 1 is a pictorial representation of the tool used for inserting a circuit board in and aligning with the contact assembly.

Illustrated in FIG. 1 is a pictorial illustration of one embodiment of the invention. A base plate 10 has the contact assembly holder 11 mounted thereon. The base plate 10 can is generally rectangular and should have sufficient weight to hold the contact assembly 11 in place with out moving, or alternatively, the base plate 10 may be secured to a work surface with screws or bolts.

The contact assembly has a groove 12 in one edge. This groove is used to position the contact assembly both vertically and horizontally so that a printed circuit board can be inserted into the contact assembly. A pin mount 13 is positioned at one end of the contact assembly holder, with the top of the pin mount level with the bottom of the groove 12. A pin 14 is mounted on or formed as a part of the pin mount, and is inserted into an index hole on a printed circuit board as herein after described.

An end contact spacing selector 15 is positioned at the end of the contact assembly holder opposite from the pin 14. The contact spacing selector is used to compensate for various spacings used with differently space contact fingers. A groove 6 is formed in the edge of the spacing selector 15 to received the end of the contact finger carrier strip. The stepped portion 17 of the contact assembly holder allows for the carrier strip so that it will not interfere with the insertion of the contact finger assembly into the alignment groove 12.

Figure 2:
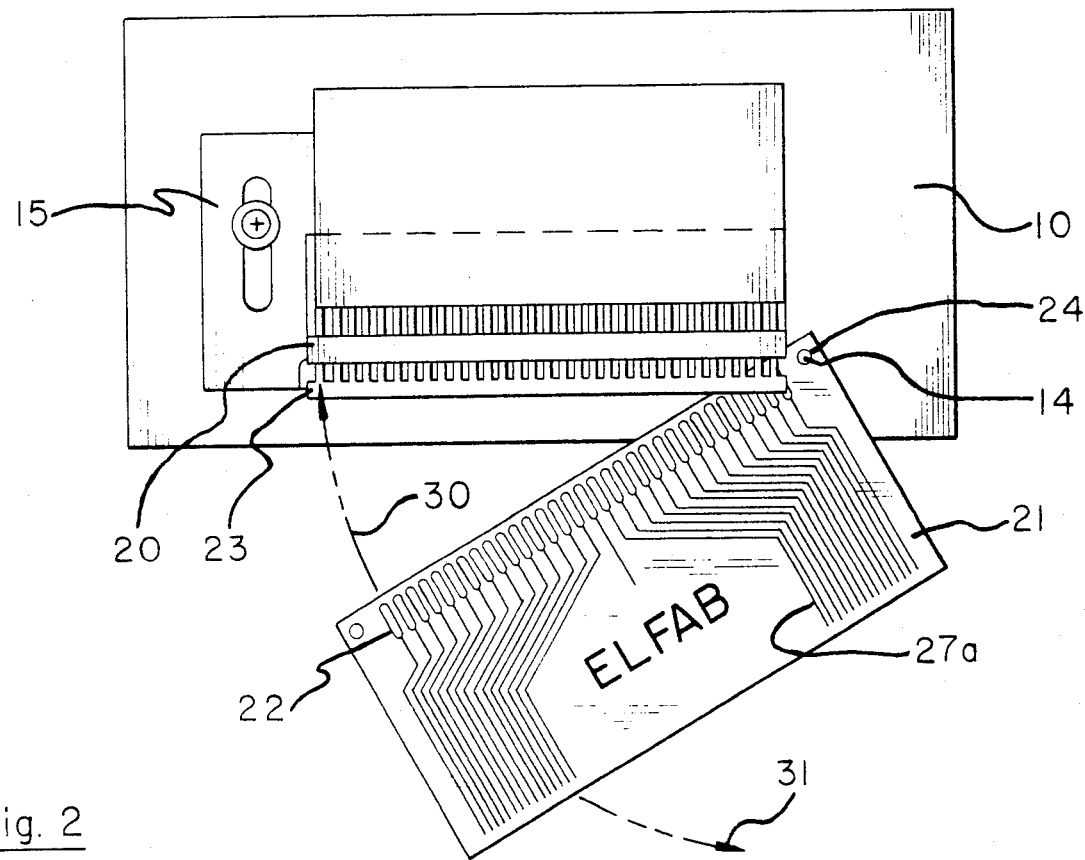
FIG. 2 Illustrates a circuit board on the insertion tool with the aligning pin in the alignment hole on the circuit board.

FIG. 2 illustrates the insertion tool of FIG. 1 with a printed circuit board positioned on the index pen 14. A contact assembly 20 is positioned in the alignment groove 12, the groove extending along the length of the contact assembly holder and against the contact spacing selector 15. Printed circuit board 21 is positioned with alignment pin 14 in the alignment hole 24. The circuit board has wiring patterns 22a which terminate in the solder pads 22. The contact assembly is to be mounted on the printed circuit board so that the contact fingers 18 are aligned with and positioned over the solder pads 22. After the printed circuit board 21 is positioned on alignment pin 14, it is rotated as illustrated by arrow 30 to insert the solder pads one at a time between the contact finger on the contact assembly. By inserting the solder pads one at a time, the insertion force is reduced significantly from what it would be if the printed circuit board were to insert directly into the contact assembly engaging all the contact fingers with all the solder pads simultaneously. After the circuit boards has been inserted into the contact assembly, the circuit board is rotated in the opposite direction as indicated by arrow 31. Since opposing contact fingers in the contact assembly are spaced apart less than the thickness of the printed circuit board and solder pads, the contact assembly will grip the circuit board and will be withdrawn from the alignment tool 11, mounted on the circuit board, and the contact fingers will be in perfect alignment with the solder pads.

Upon removal from the alignment tool, the contact assembly is solder or otherwise bonded to the printed circuit board as illustrated in co-pending patent application Ser. No. 411,516, filed August 25, 1982 and titled PRINTED CIRCUIT BOARD FINGER CONNECTOR AND METHOD OF MANUFACTURE.

Figure 3:
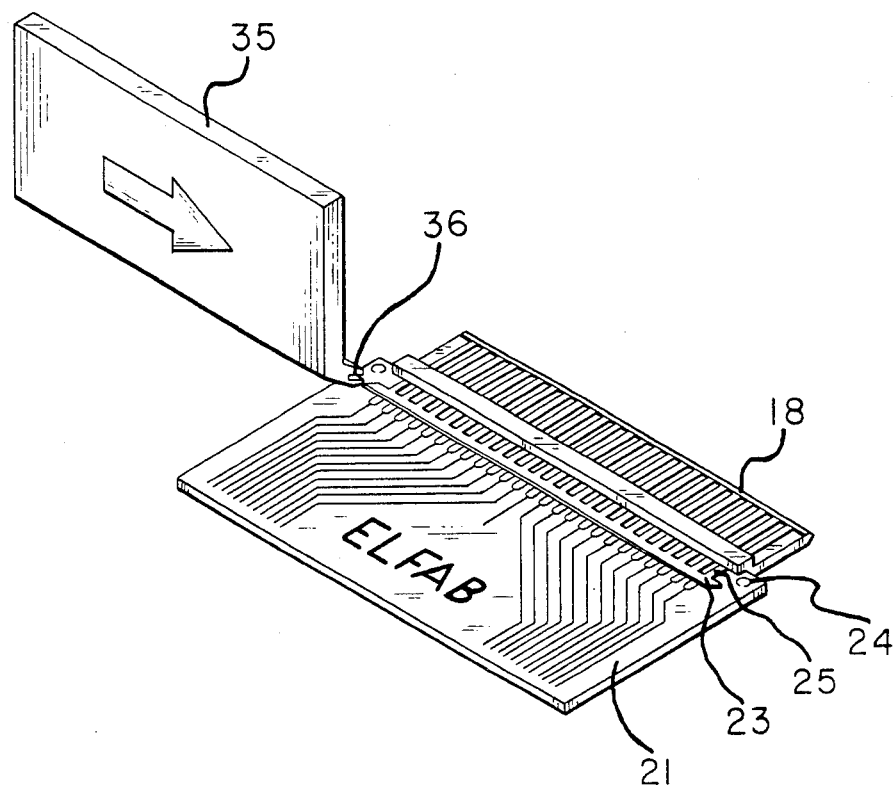
FIGS. 3 and 4 illustrate the procedure for removing the carrier strip from the contact fingers.
Figure 4:
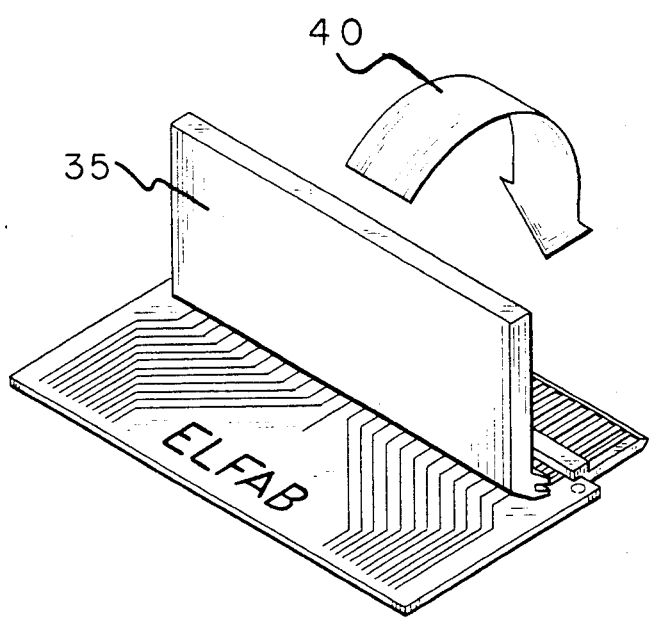

After the connector assembly is bonded to the printed circuit board, the carrier strips connecting the contact fingers are removed as illustrated in FIGS. 3 and 4.

In the bonding process, the carrier strip 23 is not bonded to the printed circuit board. The carrier strip is at an elevated position from the circuit board. A break off tool 35 has a narrow grove 36 offset in one side. The carrier strip is inserted in the grove 36. The break off tool 35 is then rotated as illustrated by arrow 40 in FIG. 5. The carrier strip breaks away from the contact finger, electrically and mechanically separating the finger contacts from each other.

Figure 5:
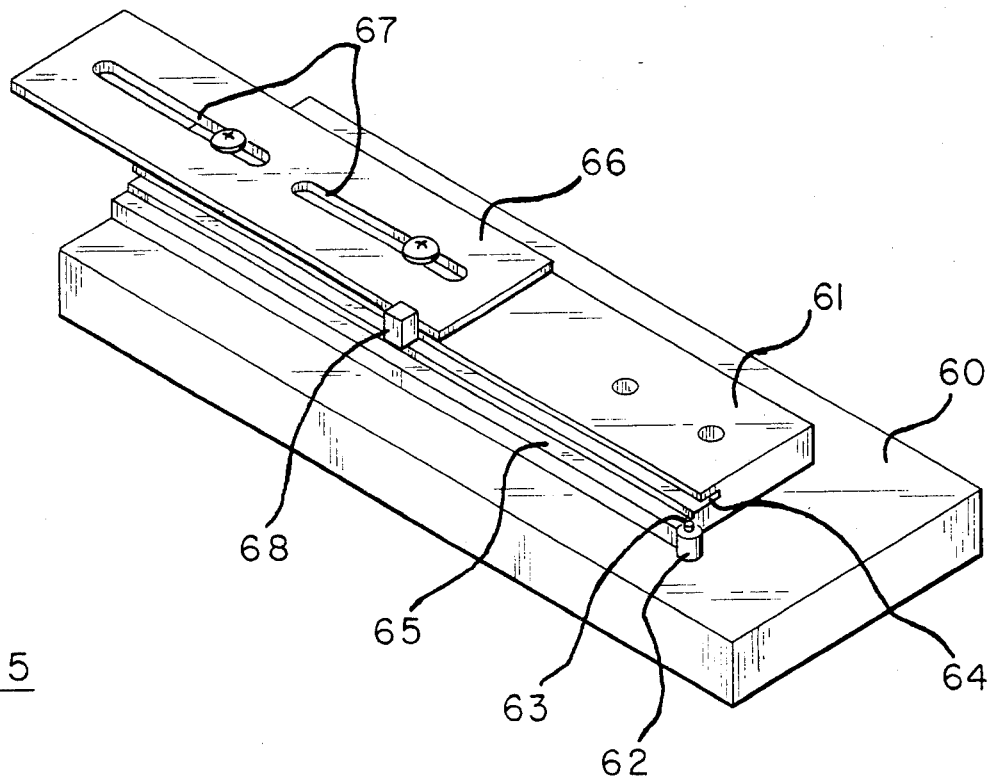
FIGS. 5 and 6 illustrate a second embodiment of the invention having provision for variable length contact assemblies.
Figure 6:
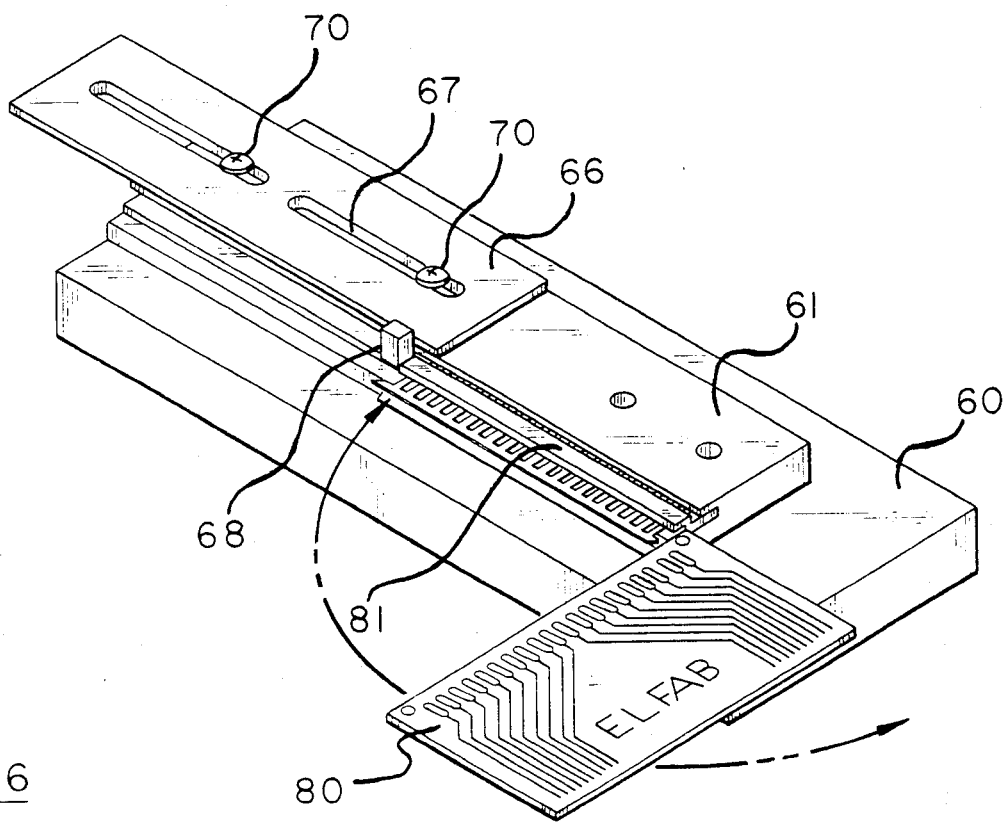

FIGS. 5 and 6 illustrate another embodiment of the invention which will take contact assemblies of different lengths. Contact assembly holder 61 is mounted on base 60. Pin mount 62 with alignment pin 63 is positioned at one end and slightly in front of contact assembly holder 61. A moveable stop 68 is attached to plate 66 which moves in slots 67. By moving plate 66, stop 68 is positioned along contact assembly slot 64 to accommodate different length contact assemblies. The operation of the tool is the same as the embodiment in FIGS. 1-4.

FIG. 6 illustrates the embodiment of FIG. 5 with a printed circuit board mounted on the alignment pin 63.

While a specific embodiment of an insertion tool has been illustrated and a specific method of inserting a printed circuit board into a contact assembly using the described tool, other embodiments of the tool and methods will be suggested to those skilled in the art without without departing from the spirit and scope of the invention as defined in the following claims.

What is claimed:

1. A method of inserting a printed circuit board, having equally spaced conductive patterns on the edge of at least one side of the printed circuit board, into and between equally spaced opposing contact fingers on a printed circuit board edge connector, comprising the steps of; positioning the printed circuit board and card edge connector in a predetermined relation to each other and rotating the printed circuit board between the opposing contact fingers so that the conductive patterns on the edge of the printed circuit board are sequentially inserted between and come into contact with the contact fingers.

2. A method of joining a card edge connector having two rows of equally spaced opposing contact fingers and a printed circuit board having conductive strips, on the edge of the board, with the same spacing as the opposing contact fingers, comprising the steps of; securing the card edge connector in a fixed position, positioning the printed circuit board in a predetermined position adjacent to the card edge connector, rotating the printed circuit board in a first direction between the opposing contact fingers one conductive strip at a time until each conductive strip is between opposing contact fingers, and rotating the printed circuit board in a second direction to remove the printed circuit board with the card edge connector thereon from said fixed position.

3. The method according to claim 2 wherein the printed circuit board is rotated about an alignment pin utilizing an indexing hole on the printed circuit board.

4. The method according to claim 2 including the step of bonding the contact fingers to the conductive strips on the printed circuit board.

5. A tool for inserting a card edge connector on a printed circuit board having equally spaced conductive areas on the edge of the printed circuit board, the edge connector having two rows of opposing contact fingers having the same spacing as the conductive areas on the edge of the printed circuit board, comprising; a mounting base, means for holding the card edge connector secured to said mounting base, indexing means mounted on said mounting base adjacent to the means for holding the connector for aligning the printed circuit board with the connector such that the printed circuit board can be rotated in one direction to insert, one at a time, the conductive areas on the printed circuit board between the opposing contact fingers of the edge connector, and then rotated in the other direction to remove the edge connector from the means for holding the edge connector.

6. A tool for inserting a printed circuit board, having conductors thereon and an indexing hole therein, into and in alignment with opposing contact fingers on a contact assembly, comprising; a mounting base, a contact assembly holder mounted on and secured to said mounting base, and an alignment pin, said contact assembly holder having a groove extending the length of the contact assembly holder for receiving a contact assembly, said alignment pin extending vertically from the surface of the mounting base adjacent to one end of the groove in the contact assembly holder, whereby a printed circuit board, having an indexing hole, is positioned with the alignment pin in the indexing hole, and is rotated about the indexing pin to insert the circuit board into opposing contacts in the contact assembly.

7. The tool according to claim 6 including adjustable means attached to the contact holder assembly and having one part thereof which determines the length of the groove in the contact holder assembly open for receiving a contact assembly to position the contact assembly to accommodate assemblies of different lengths.

8. The tool according to claim 6 wherein the groove in the contact assembly holder is dimensioned to hold the contact holder in position during the insertion of the printed circuit board while permitting the contact assembly to be rotated out of the groove after the circuit board has been inserted into the opposing contact fingers.

9. The tool according to claim 6 wherein the location of the alignment pin with respect to the contact assembly is independent of the number of contact fingers in the contact assembly and the spacing between contact fingers.

* * * * *